(12) United States Patent
Srinivasan et al.

(10) Patent No.: US 10,180,481 B2
(45) Date of Patent: Jan. 15, 2019

(54) SYSTEM AND METHOD OF MAGNETIC RESONANCE IMAGING USING VARIABLE FLIP ANGLE BALANCED STEADY-STATE FREE PRECESSION (VFA-BSSFP)

(71) Applicant: The Regents of the University of California, Oakland, CA (US)

(72) Inventors: Subashini Srinivasan, Los Angeles, CA (US); Daniel B. Ennis, Manhattan Beach, CA (US)

(73) Assignee: The Regents of the University of California, Oakland, CA (US)

( * ) Notice: Subject to any disclaimer, the term of this patent is extended or adjusted under 35 U.S.C. 154(b) by 523 days.

(21) Appl. No.: 14/777,081

(22) PCT Filed: Mar. 14, 2014

(86) PCT No.: PCT/US2014/029169
§ 371 (c)(1),
(2) Date: Sep. 15, 2015

(87) PCT Pub. No.: WO2014/144662
PCT Pub. Date: Sep. 18, 2014

(65) Prior Publication Data
US 2016/0033610 A1 Feb. 4, 2016

Related U.S. Application Data

(60) Provisional application No. 61/791,747, filed on Mar. 15, 2013.

(51) Int. Cl.
*G01R 33/563* (2006.01)
*G01R 33/48* (2006.01)
(Continued)

(52) U.S. Cl.
CPC ..... *G01R 33/56325* (2013.01); *G01R 33/482* (2013.01); *G01R 33/5613* (2013.01);
(Continued)

(58) Field of Classification Search
CPC ............ G01R 33/56325; G01R 33/482; G01R 33/5613; G01R 33/5614; G01R 33/5635; G01R 33/5673; G01R 33/56341
See application file for complete search history.

(56) References Cited

U.S. PATENT DOCUMENTS 6,230,039 B1 * 5/2001 Stuber .................... A61B 5/055
324/307
2003/0220560 A1 11/2003 Kuehn
(Continued)

OTHER PUBLICATIONS

Breuer et al., "Dynamic Autocalibrated Parallel Imaging Using Temporal GRAPPA (TGRAPPA)". Magnetic Resonance in Medicine. 2005. 53:981-985.
(Continued)

*Primary Examiner* — Gregory H Curran
(74) *Attorney, Agent, or Firm* — Quarles & Brady LLP

(57) ABSTRACT

The present invention provides methods for reducing SAR during real-time MR imaging. The method improves the safety of cine imaging, while, in certain embodiments, do not decrease image quality. The method of the invention thereby allows for the use of higher field strengths that are sometimes necessary to provide the most diagnostic information. The present invention also provides methods for improving contrast-to-noise ratio, while not increasing SAR.

23 Claims, 10 Drawing Sheets

(51) Int. Cl.
G01R 33/561 (2006.01)
G01R 33/567 (2006.01)

(52) U.S. Cl.
CPC ..... *G01R 33/5614* (2013.01); *G01R 33/5635* (2013.01); *G01R 33/5673* (2013.01); *G01R 33/56341* (2013.01)

(56) References Cited

U.S. PATENT DOCUMENTS

2005/0240095 A1 10/2005 Schaffter
2008/0150528 A1 6/2008 Cunningham et al.
2008/0278159 A1 11/2008 Park
2009/0273343 A1 11/2009 Borthakur et al.

OTHER PUBLICATIONS

Busse et al., "Fast Spin Echo Sequences With Very Long Echo Trains: Design of Variable Refocusing Flip Angle Schedules and Generation of Clinical T2 Contrast". 2006. Magnetic Resonance in Medicine. 55:1030-1037.
Busse, "Reduced RF Power Without Blurring: Correcting for Modulation of Refocusing Flip Angle in FSE Sequences". 2004. Magnetic Resonance in Medicine: 51:1031-1037.
Fin et al., "Cardiac MR Imaging: State of the Technology". Radiology. Nov. 2006. 241(2):338-354.
Griswold et al., "Generalized Autocalibrating Partially Parallel Acquisitions (GRAPPA)". Magnetic Resonance in Medicine. 2002. 47:1202-1210.
Hennig et al., "Multiecho Sequences With Variable Refocusing Flip Angles: Optimization of Signal Behavior Using Smooth Transitions Between Pseudo Steady States (TRAPS)". Magnetic Resonance in Medicine. 2003. 49:527-535.
Hennig et al., "Optimization of Signal Behavior in the Transition to Driven Equilibrium in Steady-State Free Precession Sequences". Magnetic Resonance in Medicine. 2002. 48:801-809.
Kellman et al., "Adaptive Sensitivity Encoding Incorporating Temporal Filtering (TSENSE)". Magnetic Resonance in Medicine. 2001. 45:846-852.
Larson et al., "Preliminary Investigation of Respiratory Self-Gating for Free-Breathing Segmented Cine MRI". Magnetic Resonance in Medicine. Jan. 2005. 53(1):159-168.
Markl et al., "On Flow Effects in Balanced Steady-State Free Precession Imaging: Pictorial Description, Parameter Dependence, and Clinical Implications". Journal of Magnetic Resonance Imaging. 2004. 20:697-705.
Paul and Hennig, 2004, In Proceedings of the $12^{th}$ Meeting of International Society for Magnetic Resonance in Medicine (ISMRM), Kyoto, Japan; 2663.
Paul et al., "T2-Weighted Balanced SSFP Imaging (T2-TIDE) Using Variable Flip Angles". Magnetic Resonance in Medicine. 2006. 56:82-93.
Paul et al., "lmroved SNR in linear reordered 2D bSSFP imaging using variable flip angles" Magnetic Resonance in Medicine. 2009. 27:933-941.
Pruessmann et al., "SENSE: Sensitivity Encoding for Fast MRI". Magnetic Resonance in Medicine. 1999. 42:952-962.
Srinivasan et al., "Very low SAR imaging of the lower leg using variable angle for uniform signal excitation (VUSE) and balances SSFP without RF phase cycling". Proc. Intl. Soc. Mag. Reson. Med. 2012. 20:2500.
Stehling, "Improved Signal in "Snapshot" Flash by Variable Flip Angles". Magnetic Resonance Imaging. 1992. 10:165-167.
Worters et al., "Balanced SSFP Transient Imaging Using Variable Flip Angles for a Predefined Signal Profile". Magnetic Resonance in Medicine. 2010. 64:1405-1413.

\* cited by examiner

SYSTEM AND METHOD OF MAGNETIC RESONANCE IMAGING USING VARIABLE FLIP ANGLE BALANCED STEADY-STATE FREE PRECESSION (VFA-BSSFP)

CROSS-REFERENCE TO RELATED APPLICATIONS

This application represents the national stage entry of PCT/US2014/029169 filed Mar. 14, 2014, which claims benefit of U.S. Provisional Patent Application 61/791,747, filed Mar. 15, 2013. The contents of this application are hereby incorporated by reference as set forth in their entirety herein.

BACKGROUND OF THE INVENTION

Cardiac cine imaging is routinely performed clinically using balanced steady-state free precession (bSSFP) (Finn et al., 2006, Radiology 241(2):338-354) (i.e TrueFISP, b-FFE and FIESTA) due to its high blood-myocardium contrast-to-noise ratio (CNR) and high signal-to-noise ratio (SNR) efficiency. The blood-myocardium CNR for spoiled gradient echo imaging technique strongly depends on inflow, which can result in low blood-myocardium CNR, especially in patients with impaired cardiac function. The SNR in bSSFP is dependent on the $T_2^*/T_1$ values of the tissues. Due to the inherent differences in $T_2^*/T_1$ values between myocardium and blood, bSSFP imaging provides higher CNR, even for patients with impaired myocardial function. The bSSFP blood SNR also increases with increasing flip angle (FA) (Markl and Pelc, 2004, J Magn Reson Imaging 20(4):697-705) due to the dependence of the blood signal on in-flow velocity and out of slice effects (Markl and Pelc, 2004, J Magn Reson Imaging 20(4):697-705). The use of higher FAs with a short TR, however, results in substantially increased specific absorption rate (SAR; W/kg), which limits achievable SNR and CNR and can restrict the use of bSSFP for applications such as imaging patients with implanted devices (e.g. pacemakers and ICDs) and imaging at higher field strengths (≥3 T).

Variable Flip Angle (VFA) imaging approaches have been developed to lower SAR for spin echo imaging (Hennig et al., 2003, Magn Reson Med 49(3):527-535; Busse et al., 2006, Magn Reson Med 55(5):1030-1037), to obtain $T_2$-weighted contrast with bSSFP (Paul et al., 2006, Magn Reson Med 56(1):82-93) or SSFP-echo (Srinivasan et al., 2012, In Proceedings of 20th Annual Meeting of ISMRM, Melbourne, Australia; 290.) sequences, to increase spatial resolution for bSSFP imaging (Worters and Hargreaves, 2010, Magn Reson Med 64(5):1404-1412); and to increase SNR in bSSFP (Paul and Zaitsev, 2009, Magn Reson Imaging 27(7):933-941) and spoiled gradient echo (Stehling, 1992, Magn Reson Imaging 10(1):165-167) non-cine imaging. All of these techniques have used single-shot or multi-shot imaging, but without application to cardiac cine imaging, which is conventionally acquired using segmented k-space acquisitions.

Conventional k-space segmented cardiac cine bSSFP images (FIG. 1A) acquire the first k-space segment for each cardiac phase during the first cardiac cycle (R-R interval) followed by the acquisition of the second segment for each cardiac phase during the second cardiac cycle and so on until all k-space segments are acquired. However, various VFA schemes coupled to segmented k-space acquisitions and bSSFP are not able to reduce the overall SAR of the sequence efficiently and produce significant image artifacts.

Thus, there is a need in the art for an improved system and method for lower SAR or higher contrast cardiac cine imaging. The present invention satisfies this need.

SUMMARY OF THE INVENTION

The present invention relates to a method of obtaining one or more images during real-time MR imaging. The method includes the steps of delivering a plurality of radiofrequency (RF) pulses in an MRI pulse sequence during consecutive cycles, wherein the RF pulse amplitude is modulated to maintain a dynamic steady state and the acquisition is structured to acquire low spatial frequencies with high flip angles and high spatial frequencies with low flip angles.

In one embodiment, the method also includes the step of imaging an object by acquiring segments of a k-space, wherein a high flip angle is used for acquiring the contrast information at the center of the k-space, and a low flip angle is used for acquiring the object's edge information at the edges of the k-space. In another embodiment, the acquisition of k-space segments is asynchronous.

In one embodiment, the method maintains image quality while reducing specific absorption rate (SAR). In one embodiment, the method maintains SAR while improving image contrast.

In another embodiment, the high flip angle is about 50°-100°. In another embodiment, the low flip angle is about 5°-30°. In another embodiment, the resulting image is a 2-D image. In another embodiment, the resulting image is a 3-D image. In another embodiment, the varied flip angle pattern is trapezoidal. In another embodiment, the SAR is reduced by at least 10% compared to conventional sCFA-bSSFP imaging with similar CNR. In another embodiment, the SAR is reduced by at least 20% compared to conventional sCFA-bSSFP imaging with similar CNR. In another embodiment, the SAR is reduced by at least 30% compared to conventional sCFA-bSSFP imaging with similar CNR. In another embodiment, the method is used for at least one of cardiac cine imaging, dynamic imaging, diffusion weighted imaging, and angiography.

The present invention also relates to a system for producing one or more images during real-time MR imaging. The system includes a circuit in communication with a MRI system configured to deliver a plurality of RF pulses in an MRI pulse sequence during consecutive cycles, wherein the RF pulse amplitude is modulated to maintain a dynamic steady state and the acquisition is structured to acquire low spatial frequencies with high flip angles and high spatial frequencies with low flip angles.

In one embodiment, the circuit is configured for acquiring segments of a k-space, wherein a high flip angle is used for acquiring the contrast information at the center of the k-space, and a low flip angle is used for acquiring the object's edge information at the edges of the k-space.

In one embodiment, the system maintains image quality while reducing specific absorption rate (SAR). In one embodiment, the system maintains SAR while improving image contrast.

In another embodiment, the acquisition of k-space segments is asynchronous. In another embodiment, the high flip angle is about 50°-100°. In another embodiment, the low flip angle is about 5°-30°. In another embodiment, an image produced by the system is a 2-D image. In another embodiment, an image produced by the system is a 3-D image. In another embodiment, the varied flip angle pattern is trapezoidal. In another embodiment, the SAR is reduced by at least 10% compared to conventional sCFA-bSSFP imaging with similar CNR. In another embodiment, the SAR is reduced by at least 20% compared to conventional sCFA-bSSFP imaging with similar CNR. In another embodiment, the SAR is reduced by at least 30% compared to conventional sCFA-bSSFP imaging with similar CNR. In another embodiment, the system is used for at least one of cardiac cine imaging, dynamic imaging, diffusion weighted imaging, and angiography.

BRIEF DESCRIPTION OF THE DRAWINGS

The following detailed description of preferred embodiments of the invention will be better understood when read in conjunction with the appended drawings. For the purpose of illustrating the invention, there are shown in the drawings embodiments which are presently preferred. It should be understood, however, that the invention is not limited to the precise arrangements and instrumentalities of the embodiments shown in the drawings.

FIG. 1A and FIG. 1B, is an illustration of the variable flip angle method of the present invention. The illustration shows a comparison of conventional segmented k-space acquisition (FIG. 1A) to the asynchronous VFA-bSSFP cardiac cine technique (FIG. 1B) showing the k-space acquisition of seven cardiac phases during the first two RR-intervals. The VFA-bSSFP scheme is asynchronous to the RR-interval as shown on the top. $\Delta t$, $2\Delta t$, etc indicate the acquisition order of the different segments where $\Delta t$ is the acquisition duration for each segment. The VFA-bSSFP scheme varies from $\alpha_{low}$ to $\alpha_{high}$ and back to $\alpha_{low}$ linearly or non-linearly across k-space, which reduces the SAR, while maintaining image contrast.

FIG. 3A through FIG. 3C, depicts the results of experiments. (FIG. 3A) The FA scheme for the CFA-bSSFP (70°) and VFA-bSSFP (30_70_40_80, $\alpha_{low}$-$\alpha_{high}$-$N_{ramp}$-$N_{high}$). The measured and simulated (FIG. 3B) transverse magnetization (phantom $T_1/T_2$=100/100 ms) for the CFA-bSSFP (dashed line) and VFA-bSSFP (solid line) schemes are shown. The simulations and measurements confirm that after ~150 echoes CFA-bSSFP transverse magnetization reaches a steady-state, whereas VFA-bSSFP transverse magnetization results in a dynamic steady-state. In (FIG. 3C) simulations of stationary myocardium ($T_1/T_2$:867/57 ms) and flowing blood ($T_1/T_2$:1200/200 ms, $\Delta s$: 50%) for both CFA-bSSFP and VFA-bSSFP are shown.

FIG. 4A through FIG. 4F, depicts the results of experiments. Dynamic steady state resolution phantom images acquired with 30_70_40_80 VFA-bSSFP (FIG. 4A) scheme and CFA-bSSFP of 70° (FIG. 4C) are shown. The corresponding zoomed images are shown in (FIG. 4B) and (FIG. 4D) with line profiles drawn over the sixth (FIG. 4e) and second (FIG. 4F) row (from left to right) of the resolution phantom for VFA-bSSFP (black solid line) and CFA-bSSFP (gray dashed line). The phase encoding (P) and the readout (R) axes are labeled.

FIG. 5, comprising

FIG. 6A through FIG. 6D, depicts the results of experiments. Phantom images acquired with an additional gradient of 200 µT/m along the readout direction for 30_70_40_80 VFA-bSSFP (FIG. 6A) scheme and CFA-bSSFP of 70° (FIG. 6C) are shown. Simulated frequency profiles (solid line) and measured line profiles (dashed line) are shown for VFA-bSSFP (FIG. 6B) and CFA-bSSFP (FIG. 6D). The phase encoding (P) and the readout (R) axes are labeled FIG. 7, comprising

FIG. 8A through FIG. 8D, depicts the results of experiments. Diastolic (top row) and systolic (bottom row) images of a volunteer acquired with aCFA-bSSFP (FIG. 8A and FIG. 8B) of 70° and 50_98_40_40 aVFA-bSSFP (FIG. 8C and FIG. 8D) scheme. aVFA-bSSFP has improved blood-myocardium CNR compared to aCFA-bSSFP (49±9 vs. 38±8, P<10$^{-4}$) with similar SAR (3.2±0.5 vs. 3.3±0.5 W/kg, P=0.6).

DETAILED DESCRIPTION

Definitions

Figure 1:
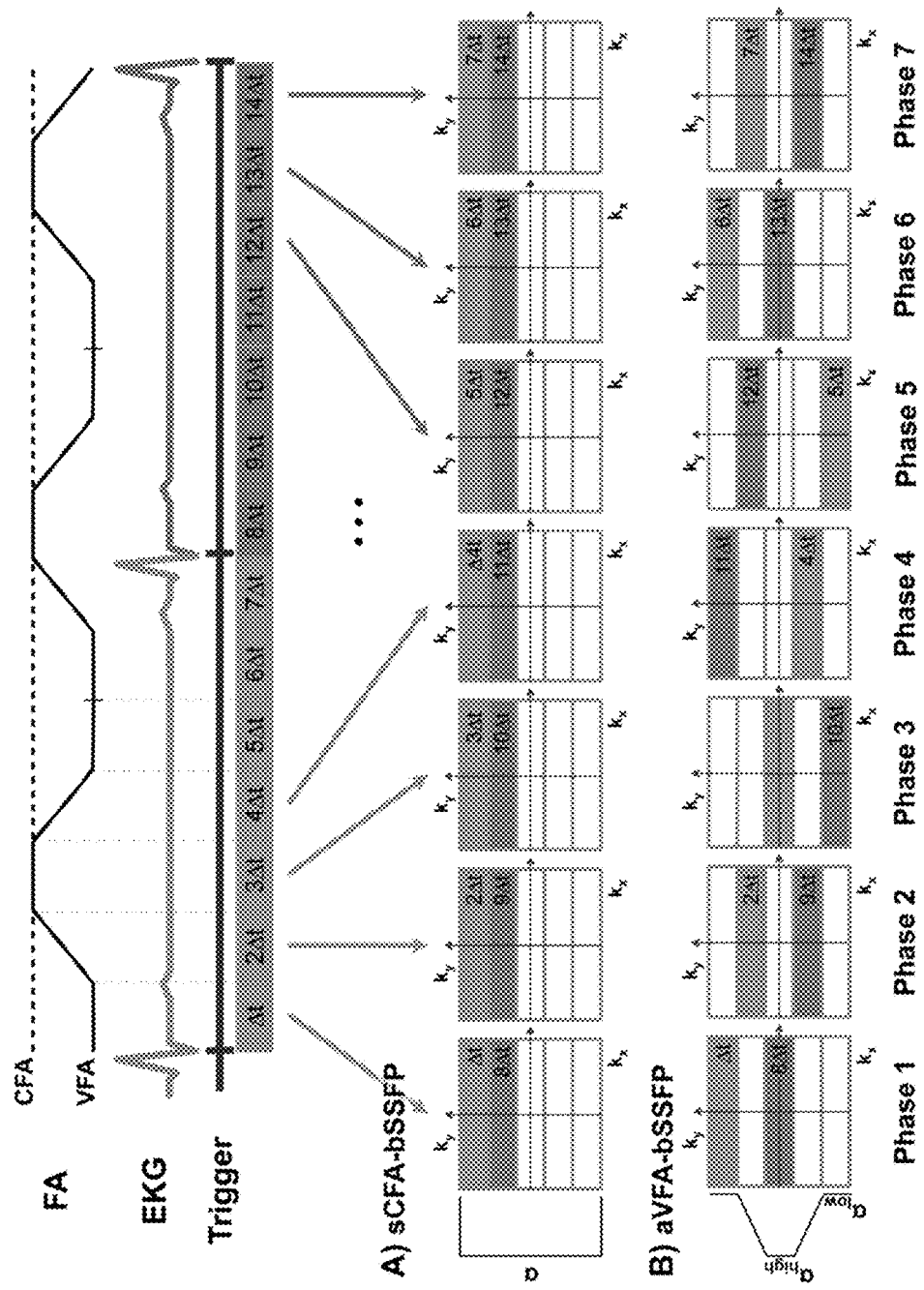
FIG. 1, comprising

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%±10%, ±5%, ±1%, or ±0.1% from the specified value, as such variations are appropriate to perform the disclosed methods.

Ranges: throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

Description

The present invention generally relates to systems and methods for producing high quality real-time MR imaging with improved patient safety or improved image quality. For example, the methods described herein allow for acquisition of high contrast-to-noise ratio (CNR) and high signal-to-noise ratio (SNR) images, while minimizing the specific absorption rate (SAR). SAR, generally measured in units of Watts/kilogram (W/kg), is a measure of the rate at which energy is absorbed by the body when exposed to electromagnetic field. For MRI, the maximum SAR for imaging protocols can be governed by local or federal regulations. The present invention describes a low SAR method that does not sacrifice image quality. In one embodiment, the method allows for imaging at higher field strengths (e.g. 3 T), that is sometimes necessary or preferred to obtain more informative images. In certain embodiments, the method allows for safer imaging of patients, including at-risk patients, pediatric patients, and patients with implantable devices.

In one embodiment, the invention provides a method of maintaining image quality while reducing SAR during real-time MR imaging, comprising delivering a plurality of RF pulses in an MRI pulse sequence during consecutive cycles, wherein the RF pulse amplitude is modulated to maintain a dynamic steady state and the acquisition is structured to acquire low spatial frequencies with high flip angles and high spatial frequencies with low flip angles.

In one embodiment, the method comprises imaging an object comprising acquiring segments of a k-space, wherein a high flip angle is used for acquiring the contrast information at the center of the k-space, and a low flip angle is used for acquiring the object's edge information at the edges of the k-space.

In MR imaging, the k-space is a temporary memory of the spatial frequency information in two or three dimensions of an object. The k-space is defined by the space covered by the phase and frequency encoding data. The relation between K-space data and image data is the Fourier Transformation. The data acquisition matrix contains raw image data before the image processing. In 2 dimensional Fourier transformation imaging, a line of data corresponds to the digitized MRI signal at a particular phase encoding level. The position in k-space is directly related to the gradient across the object being imaged. By changing the gradient over time, the k-space data are sampled in a trajectory through Fourier space at each point until it is filled.

For example, the method described herein may be used for 2-D imaging, 3-D imaging, real-time imaging, cine imaging, dynamic imaging, high-field imaging, diffusion weighted imaging, diffusion tensor imaging (DTI), imaging patients with implanted devices and any other cardiac or non-cardiac cine application that may be limited by SAR. However, the present invention is not limited to any particular type of imaging. For example, the technique may be used for evaluating cerebral, abdominal, or thoracic blood flow, peripheral angiography, renal angiography, diffusion in the brain or skeletal muscles, or to measure blood perfusion in any organ. For example, the present invention can be used in the evaluation of cardiac function, blood flow, cardiac anatomy, vascular anatomy, cardiac perfusion, cardiac tissue characterization and the like. The technique described herein can be used on any patient including at-risk patients, pediatric patients, and patients with implantable device. Further, the present invention is suitable for 2D or 3D free-breathing imaging and breath hold imaging.

Cardiac cine imaging is performed clinically using balanced SSFP (bSSFP) (Finn et al., 2006, Radiology, 241(2): 338-354) due to its high blood-myocardial contrast and SNR efficiency. Higher flip angles (FA) generate higher blood-myocardium contrast (Hennig et al., 2003, Magnetic Resonance in Medicine, 49(3): 527)), but can result in substantially increased SAR, which may result in exceeding SAR limitations. In one embodiment, the present invention comprises the use of variable flip angle (VFA) sequences to reduce SAR. While certain VFA techniques have been implemented in other imaging formats, until now they have not been compatible with cardiac cine imaging due to the current conventional k-space acquisition scheme used for cardiac cine imaging. In one embodiment, the present invention uses an asynchronous k-space acquisition scheme.

In one embodiment, the present invention uses asynchronous k-space acquisition (FIG. 1B) for VFA-bSSFP cardiac cine imaging, which is asynchronous to the cardiac cycle, termed as aVFA-bSSFP. This is equivalent to acquiring multiple single-shot images of the same slice and retrospectively rebinning the data based on the phase of the cardiac cycle.

In one embodiment, the aVFA-bSSFP technique described herein is used for cardiac cine imaging. In one embodiment, the aVFA-bSSFP technique lowers the SAR of cardiac cine bSSFP imaging while maintaining blood-myocardium CNR similar to conventional segmented constant FA bSSFP (sCFA-bSSFP). For example, in one embodiment, the aVFA-bSSFP technique lowers the SAR by greater than 10% compared to conventional sCFA-bSSFP imaging with similar CNR. In another embodiment, the aVFA-bSSFP technique lowers the SAR by greater than 20% compared to conventional sCFA-bSSFP imaging with similar CNR. In another embodiment, the aVFA-bSSFP technique lowers the SAR by greater than 30% compared to conventional sCFA-bSSFP imaging with similar CNR. In another embodiment, the aVFA-bSSFP technique lowers the SAR by greater than 40% compared to conventional sCFA-bSSFP imaging with similar CNR. In another embodiment, the aVFA-bSSFP technique lowers the SAR by greater than 50% compared to conventional sCFA-bSSFP imaging with similar CNR.

In another embodiment, the aVFA-bSSFP technique increases the blood SNR and blood-myocardium CNR compared to asynchronous constant FA bSSFP (aCFA-bSSFP)

with similar SAR. For example, in one embodiment, the aVFA-bSSFP technique increases SNR by greater than 10% compared to aCFA-bSSFP imaging with similar SAR. In another embodiment, the aVFA-bSSFP technique increases SNR by greater than 20% compared to aCFA-bSSFP imaging with similar SAR. In another embodiment, the aVFA-bSSFP technique increases SNR by greater than 30% compared to aCFA-bSSFP imaging with similar SAR. In another embodiment, the aVFA-bSSFP technique increases SNR by greater than 40% compared to aCFA-bSSFP imaging with similar SAR. In another embodiment, the aVFA-bSSFP technique increases SNR by greater than 50% compared to aCFA-bSSFP imaging with similar SAR.

The VFA-bSSFP FA scheme described herein can be applied continuously any number of times to produce a dynamic steady state signal. Further, in certain embodiments, the method of the invention comprises a modified reordering scheme. For example, the conventional constant FA segmented linear or centric k-space reordering scheme of cine sequences is modified such that the center of k-space is acquired with high FA (during the maximum of the cyclic steady state signal) and the outer k-space lines are acquired with a low FA (during the minimum of the cyclic steady state signal). For cardiac cine imaging this acquisition may be asynchronous to the cardiac cycle. This reduces SAR, while maintaining image contrast.

While the description of the invention may be exemplified using cardiac cine imaging, those skilled in the art should recognize that the present invention is equally applicable to other imaging applications, including for example dynamic MRI, diffusion MRI, non-contrast angiography, dynamic contrast-enhanced imaging, and the like. For example, the present invention encompasses non-cardiac or cardiac imaging, where the images are acquired during different cardiac phases. In certain embodiments, the present invention encompasses any imaging application using segmented k-space acquisition.

In certain embodiments, the VFA technique and/or asynchronous image acquisition described herein may be used for any application that require or would benefit from imaging in relation to the cardiac cycle or other physiological data (e.g. respiratory rate). For example, the present invention may be used for non-contrast MR angiography, where images acquired from the systolic and diastolic phases of the cardiac cycle may be subtracted at particular time intervals to enhance contrast of the blood vessels. In another example, the present invention may be used for diffusion MRI of the brain, where imaging with respect to the cardiac cycle or respiration can minimize motion artifacts and/or pusatility.

Flip Angle Scheme for VFA-bSSFP

Figure 2:
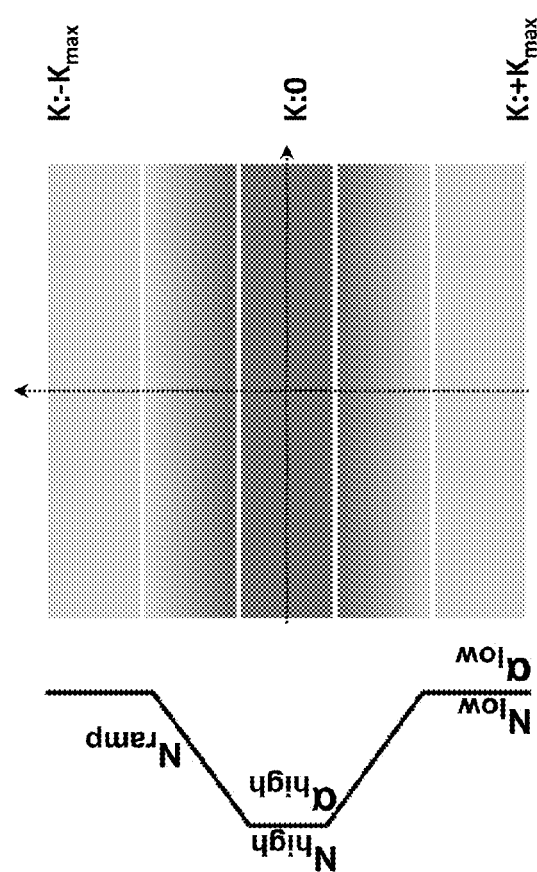
FIG. 2: VFA-bSSFP uses a trapezoidal FA scheme consisting of five different parameters: lower FA ($\alpha_{low}$), higher FA ($\alpha_{high}$), number of low pulses ($N_{low}$), number of high pulses ($N_{high}$) and number of ramp pulses ($N_{ramp}$). The $\alpha_{low}$ pulses are used to acquire the outer k-space lines to reduce the SAR, followed by the ramp pulses to catalyze a smooth transition to a higher steady state that uses $\alpha_{high}$ for increased SNR and suitable CNR.

In one embodiment, the VFA scheme uses a trapezoidal FA history (Hennig et al., 2003, Magn Reson Med, 49: 527-535) which is defined by five different parameters: a low FA ($\alpha_{low}$), a high FA ($\alpha_{high}$), the number of $\alpha_{low}$ pulses ($N_{low}$), the number of linear ramp pulses ($N_{ramp}$), and the number of $\alpha_{high}$ pulses ($N_{high}$) as shown in FIG. 2. In certain embodiments, the VFA scheme is designed such that the number of VFA ($N_{VFA}$)=$2 \times N_{low}+2 \times N_{ramp}+N_{high}=N_{ky}$ where $N_{ky}$ is the number of phase encode steps per shot. However, the present invention is not limited to any particular number of pulses during the low FA, ramp, and/or high FA. The present invention is also not limited to a particular ramp scheme, which can be linear (Paul and Zaitsev, 2009, Magn Reson Imaging 27(7):933-941), modified linear (Hennig et al., 2002, Magn Reson Med 48(5):801-809), Kaiser-Bessel pulses (Busse, 2004, Magn Reson Med 51(5):1031-1037) or any other non-linear ramp pulses (Paul and Hennig, 2004, In Proceedings of the 12th Meeting of International Society for Magnetic Resonance in Medicine (ISMRM) Kyoto, Japan; 2663) that ramp from lower FA to higher FA and vice-versa. Further, the present invention is not limited to a symmetric VFA scheme along the $N_{ky}$.

The present invention is also not limited to image acquisition without parallel imaging. The invention is compatible with parallel imaging techniques such as GRAPPA (Griswold M A et al., 2002; Magn Reson Med, 47; 1202-1210), SENSE (Pruessmann K P et al., 1999; Magn Reson Med, 42:952-962), TSENSE (Kellman P et al., 2001; Magn Reson Med, 45:846-852), TGRAPPA (Breuer F et al., 2003; Proceedings of the 11th Annual Meeting of the ISMRM, Toronto, 2330) for faster image acquisition.

In one embodiment, images are acquired using a top-down trajectory such that $\alpha_{high}$ is used to acquire the center of k-space, thereby maintaining the overall SNR and CNR of the image to be similar to conventional bSSFP. In one embodiment, the $\alpha_{low}$ pulses accord with the outer k-space lines and therefore reduce the overall SAR of the image acquisition, but concomitantly incur a loss in resolution too. The $N_{ramp}$ pulses promote a smooth transition between the lower ($\alpha_{low}$) and higher ($\alpha_{high}$) steady states, which minimizes artifacts. As used herein, a specific VFA scheme is represented as $\alpha_{low}\_\alpha_{high}\_N_{ramp}\_N_{high}$. For example, VFA scheme 30_70_40_80 is used to represent the scheme with $\alpha_{low}=30°$, $\alpha_{high}=70°$, $N_{ramp}=40$, $N_{high}=80$. For a fixed, $N_{ky}$ (e.g. $N_{ky}=204$) $N_{low}$ is calculated as, $N_{low}=[N_{ky}-(N_{high}+2 \times N_{ramp})]/2=22$. For comparison purposes, aCFA-bSSFP sequence that uses the same asynchronous acquisition and reconstruction technique as aVFA-bSSFP were evaluated.

In certain embodiments, the choice of $\alpha_{low}$ and $\alpha_{high}$ is dependent on the particular application and/or the parameter that is desired to be optimized. For example, the values of $\alpha_{low}$ and $\alpha_{high}$ can be specifically chosen if the desired application is provide the lowest possible SAR, highest possible contrast, or somewhere in between.

In one embodiment, $\alpha_{low}$ is about 0°-50°. In another embodiment, $\alpha_{low}$ is about 5°-40°. In another embodiment, $\alpha_{low}$ is about 10°-30°.

In one embodiment, $\alpha_{high}$ is about 30°-100°. In another embodiment, $\alpha_{high}$ is about 40°-80°. In another embodiment, $\alpha_{high}$ is about 50°-70°.

In one embodiment, $N_{ramp}$ is about 10-100. In another embodiment, $N_{ramp}$ is about 15-50. In another embodiment, $N_{ramp}$ is about 20-40.

In one embodiment, $N_{high}$ is about 10-120. In another embodiment, $N_{high}$ is about 20-100. In another embodiment, $N_{high}$ is about 40-80.

VFA Acquisition Strategy

In one embodiment, the method of the present invention uses an asynchronous k-space acquisition. For example, in one embodiment, the method uses asynchronous k-space acquisition with $N_{VFA}=N_{ky}$ for VFA-bSSFP where k-space is filled asynchronously with respect to the RR-interval. For example, in each RR-interval, consecutive continuous segments that span all cardiac phases are acquired without synchronization to the cardiac cycle. However, the present invention is not limited to $N_{VFA}=N_{ky}$. For example, in one embodiment, the method comprises acquisition with $N_{VFA}=2 \times N_{ky}$. In certain embodiments, the VFA scheme can be shared between two images with centric k-space ordering.

In one embodiment, the asynchronous k-space acquisition is also equivalent to acquiring multiple single-shot images which are retrospectively re-binned into different cardiac phases. The asynchronous acquisition is unlike the conventional segmented acquisition where the same k-space segment is acquired for all the cardiac phases in each RR-interval. FIG. 1 compares the segmented and asynchronous k-space acquisitions during the first two RR-intervals (cardiac cycles). An asynchronous k-space acquisition with $N_{VFA}=N_{ky}$, avoids potential limitations (i.e. ghosting, CNR fluctuations and ineffective SAR reductions) because a continuous k-space acquisition of the different cardiac phases with the consecutive trapezoidal VFA schemes are not susceptible to ghosting artifacts, maintains similar SNR and CNR during all the cardiac phases and significantly reduces the SAR.

In one embodiment, the method acquires a plurality of shots during a cardiac cycle, with each shot corresponding to a particular cardiac phase of the cardiac cycle. In one embodiment, the method is used to acquire 1-100 phases. In another embodiment, the method is used to acquire 5-50 phases. In yet another embodiment, the method is used to acquire 10-30 phases. As described elsewhere herein, the asynchronous acquisition and VFA technique produces images of each phase by using a high FA, for acquiring the contrast information at the center of the k-space, and using a low FA, for acquiring the object's edge information at the edges of the k-space. The center of the k-space contains the most information regarding the contrast of the resulting image. Thus, the method described herein does not suffer in contrast, as the contrast data is acquired when using a higher FA. By imaging over a number of cardiac cycles, a complete image for each phase is constructed, with shots using a high FA placed towards the center of the k-space, and shots using a lower FA placed towards the edges of the k-space (see FIG. 1).

In one embodiment, the method is used to fill a 2-D k-space thereby producing 2-D imaging. However, in another embodiment, the method described herein is used to acquire 3-D k-space data, thereby producing 3-D imaging.

In certain embodiments, the imaging technique described herein is coupled with physiological data of a patient. For example, the method may comprise acquiring and receiving signals from the patient using any number of different sensors that can be applied to the patient. Exemplary acquired physiological data include, but is not limited to, ECG data, respiratory data, pulse data, and the like. In one embodiment, the imaging technique is triggered or gated by a particular signal from the patient. For example, in one embodiment, the imaging technique is triggered by the detection of a particular characteristic of the recorded ECG. In one embodiment, detection of an R-wave triggers the pulse sequence. In certain embodiments, the recorded ECG is used retrospectively to aid in the reconstruction of an image.

Image Reconstruction

In one embodiment, the acquired shots obtained during the variable FA protocol described above are reconstructed to produce final images. For example, in one embodiment, the images are reconstructed retrospectively, after all the shots are acquired. In certain embodiments, the first shot is discarded during reconstruction, as it may, in certain situations consist of signal transients. In another embodiment, preparation pulses like Kaiser-Bessel or linear or other such pulses can be used to reduce the preparation duration and reduce the signal transients. Reconstruction can be performed online at the scanner or can be formed using any suitable software system, including for example MATLAB, C++, Python, or Octave.

In one embodiment, each k-space line is associated with a normalized time (between 0 and 1) based on its time-of-acquisition with respect to the corresponding RR-interval (cardiac cycle) obtained from ECG data. In one embodiment, each $k_y$-line, is linearly interpolated into a desired number of cardiac phases. Other interpolation techniques such as cardiac phase to order reconstruction (Feinstein et al., 1997, J Magn Reson Imaging 7(5):794-798) can also be used to interpolate the cardiac phases. Reconstruction may be performed using any known technique including, iterative reconstruction, discrete Fourier transform reconstruction, Radon transformation, parametric reconstruction, compressed sensing and the like.

The method described herein can be implemented in any suitable imaging system, including conventional bSSFP capable MRI systems. Exemplary systems include, but are not limited to, TrueFISP (Siemens), FIESTA (GE), and b-FFE (Phillips) capable MRI scanners.

The present invention provides a system for producing high quality real-time MR imaging with improved patient safety or improved image quality. For example, the system of the invention allows for acquisition of high contrast-to-noise ratio (CNR) and high signal-to-noise ratio (SNR) images, while minimizing the specific absorption rate (SAR). In one embodiment, the system comprises an MRI system. The MRI system comprises an MRI scanner, comprising a magnet which generates the magnet field. The field strength of the magnet is not limited in the present invention. That is, any magnet having a suitable field strength may be used in the system and method of the invention. For example, in certain embodiments, the magnet has a field strength of about 0.2 T to about 10 T.

In certain embodiments, the MRI system includes an acquisition system that comprises an MRI control system circuit and an RF transmission system circuit. The RF transmission system circuit excites the magnetization of the MRI system. In certain embodiments, the RF transmission system circuit comprises gradient hardware for slice selection, controlling spatial encoding, and/or filling of the k-space. In certain embodiments, the MRI system includes a data processing system circuit. For example, the MRI system comprises coils to receive the RF signal. In certain embodiments, the data processing system circuit digitizes and processes a received RF signal using different filtering and scaling operations known in the art.

The MRI control system circuit controls operations of the MRI acquisition system to obtain and provide MRI images during a cardiac cycle of a patient. The MRI control system circuit may also assemble and transmit the acquired images to a workstation or other such data analysis system for further analysis and/or display. The workstation may be in an MRI suite or may be remote from the MRI suite. The RF transmission system circuit and the data processing system circuit are controlled to acquire MRI signals that may provide MRI images of a region of interest.

Conventional MRI systems, such as those provided by General Electric Medical Systems, Siemens, Philips, Varian, Bruker, Marconi and Toshiba may be utilized to provide the desired MRI image frames collected according to embodiments of the present invention as described herein.

Those skilled in the art should recognize that any type of MRI system, comprising any particular division of functions and/or operations may be utilized in the present invention. For example, the MRI control system circuit could be combined with either the RF transmission system circuit or the data processing system circuit. Thus, the present invention should not be construed as limited to a particular architecture or division of MRI functions/operations but is intended to cover any architecture or division of functions/operations capable of carrying out the operations described herein.

In one embodiment, the system of the invention is configured for producing MRI images by acquiring segments of a k-space, wherein a high flip angle is used for acquiring the contrast information at the center of the k-space, and a low flip angle is used for acquiring the object's edge information at the edges of the k-space. Thus, the system is configured for altering or varying the flip angle during imaging, as described elsewhere herein.

In one embodiment, the system comprises software, which is able to communicate with the MRI system, and implements the variable flip angle imaging method described herein. For example, conventional systems, such has those listed herein, can be adapted to perform the variable FA method. In one embodiment, the software is used to program the variable FA pulse sequence. In another embodiment, the software is used for image reconstruction to produce the final images. The software may be programmed using any suitable platform, including platforms integrated with the known imaging systems.

The software may also include standard reporting mechanisms, such as generating a printable results report, electronic results report, slideshow, movie, or the like which can be transmitted to any communicatively connected computing device, such as a generated email message or file attachment, or which can be transmitted and stored on a network system. Likewise, particular results of the aforementioned system can trigger an alert signal, such as the generation of an alert email, text or phone call, to alert a patient, doctor, nurse, emergency medical technicians, or other health care provider of the particular results.

In one embodiment, the system comprises a workstation, for example a computing device, such as a desktop computer, laptop, tablet, mobile device, smartphone, or the like. In certain embodiments, the software adapted to control the MRI system using the variable flip angle imaging methodology of the invention is loaded and accessible on the workstation. The workstation may include at least one processor, standard input and output devices, as well as all hardware and software typically found on computing devices for storing data and running programs, and for sending and receiving data over a network, if needed.

The present invention further includes an imaging kit containing software implementing the imaging method described herein and instructions for the set-up, performance, monitoring, and interpretation of the methods of the present invention. Optionally, the kit may include hardware, including for example a suitable MRI scanner.

EXPERIMENTAL EXAMPLES

The invention is further described in detail by reference to the following experimental examples. These examples are provided for purposes of illustration only, and are not intended to be limiting unless otherwise specified. Thus, the invention should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the present invention and practice the claimed methods. The following working examples therefore, specifically point out the preferred embodiments of the present invention, and are not to be construed as limiting in any way the remainder of the disclosure.

Example 1: Variable Flip Angle Balanced Steady-State Free Precession (VFA-bSSFP) for Lower SAR or Higher Contrast Cardiac Cine Imaging Design of Flip Angle Scheme for VFA-bSSFP Twenty-five different aVFA-bSSFP and aCFA-bSSFP schemes (Table 1) were evaluated with simulations and imaging experiments to determine which aVFA-bSSFP scheme produced blood-myocardium CNR similar to aCFA-bSSFP of 50° and 70° while reducing SAR and with minimal loss in resolution. The schemes were chosen systematically by varying the VFA-bSSFP scheme parameters: $\alpha_{low}$ was varied from 10° to $\alpha_{high}$ in steps of 20°, $N_{ramp}$ was chosen as 20 or 40, $N_{high}$ was either 40, 80, or 100, $\alpha_{high}$ was 50°, 70°, or 90°. Only VFA-bSSFP schemes with $\Sigma FA^2$ (proportional to the SAR of the sequence for a fixed TR) lower than the corresponding CFA-bSSFP sequence were chosen.

Bloch Equation Simulations

Bloch equation simulations were performed in MATLAB (The Mathworks, Natick, Mass., USA). Simulations of the transverse magnetization ($M_{xy}$) as a function of the echo number were performed for stationary myocardium ($T_1/T_2$: 867/57 ms), flowing blood ($T_1/T_2/T_2^*$:1200/200/200 ms) and an aqueous nickel-sulfate phantom ($T_1/T_2$:100/100 ms). Both a conventional CFA-bSSFP sequence of 70° and a 30_70_40_80 VFA-bSSFP scheme were simulated. An imperfect slice profile was simulated with 20 sub-slices ($N_s$) and a 600 µs RF pulse with a time bandwidth product of 1.6 similar to Markl et al. (Markl and Pelc, 2004, J Magn Reson Imaging 20(4):697-705). The slice profile was defined by the Fourier Transform of the RF pulse. The slice profile was divided into 20 sub-slices and the flip angle for each sub-slice was defined by scaling the sub-slice's signal by the central sub-slice's signal. The other simulation parameters were spin density of the myocardium ($M_{0myo}$)=0.7, ($M_{0blood}$)=0.95 (Schär et al., 2004, Magn Reson Med 51(4): 799-806), pulse repetition time (TR)=3.070 ms, echo time (TE)=1.535 ms, number of shots ($N_{shots}$)=5, and $N_{ky}$=204. The flow simulation follows the previous work of Markl et al. (Markl and Pelc, 2004, J Magn Reson Imaging 20(4): 697-705) with a percent spin replacement per TR (Δs) of 50% and a number of out-of-slice sub-slices, $N_{os}=4 \times \Delta s \times N_s \times T_2/TR$.

Simulations of the myocardial signal and flowing blood signal were also performed for the 25 different VFA-bSSFP and CFA-bSSFP schemes (Table 1) with the same simulation parameters explained above. The simulated myocardial and flowing blood signal was calculated as the dynamic steady-state signal of the center echo number from the third shot. The resolution loss incurred by the VFA-bSSFP scheme was estimated for each of the 25 different FA schemes. The point spread function (PSF) was calculated as the Fourier transform of the dynamic steady-state signal of the third shot. The full width half max (FWHM) of the PSF was measured as the width of the PSF at half the maximum value to estimate the resolution loss.

The frequency response of the 30_70_40_80 VFA-bSSFP scheme and a 70° CFA-bSSFP scheme was simulated by calculating the signal for the phantom ($T_1/T_2$:100/100 ms) with off-resonance between −180° and 180° in 5° steps.

Imaging Experiments:

All the images were acquired on a 1.5 T scanner (Avanto; Siemens Medical Solutions, Erlangen, Germany) using a 6-channel anterior cardiac coil and 6-channel posterior spine matrix.

Phantom Imaging:

A nickel-sulfate phantom (1.25 g of $NiSO_4 \times 6 H_2O + 5$ g NaCl per 1000 g of distilled water) was imaged using multi-echo spin-echo experiments to measure $T_2$ with TR=8000 ms and TE=11, 50, 100, 150 and 200 ms. The $T_1$ values were measured using multiple inversion recovery spin-echo experiments. The imaging parameters were: TR=4000 ms, TE=9.5 ms, TI=10, 50, 75, 100, 120, 200, 300, 400, 500, 1000, 1500 and 3000 ms. The values were estimated to be $T_1/T_2$:100/100 ms by fitting the signal curves. The phantom was imaged with parameters matched to the simulations (Field of view=380×302 mm, acquisition matrix=256×204, resolution=1.5×1.5×5 mm, TE/TR=1.535/3.070 ms, Bandwidth=1502 Hz/px, $N_{shots}$=25), and VFA-bSSFP scheme (30_70_40_80). Projections were acquired with the phase encoding gradients switched-off in order to evaluate the dynamics of the transverse magnetization with high temporal resolution. The sum of the coil combined signal (using sum of squares technique) along the readout direction was compared to the simulated results.

Resolution phantom experiments were performed on a phantom with different sized disks to qualitatively compare the image sharpness acquired with VFA-bSSFP (30_70_40_80) and CFA-bSSFP (70°). Images of the plastic grid in the ACR MRI accreditation phantom (J M specialty parts, San Diego, Calif., USA) were also acquired using the 25 different FA schemes (Table 1). To quantify image blurriness the first two shots were discarded and the subsequent images from 23 consecutive shots were averaged to reduce the noise. The blurriness of a single edge of the grid was measured at three different locations similar to Larson et al. (Larson et al., 2005, Magn Reson Med 53(1):159-168) by first measuring $I_{max}$ and $I_{min}$ (maximum and minimum image intensity) points on a line profile drawn over the grid along the phase encoding direction, then computing the distance between $0.8(I_{max}-I_{min})+I_{min}$ and $0.2(I_{max}-I_{min})+I_{min}$. The imaging parameters were identical to the stationary phantom experiment.

The frequency response of the CFA-bSSFP (70°) and VFA-bSSFP (30_70_40_80) schemes were experimentally measured by applying a linear shim gradient of 200 µT/m along the readout direction using the nickel-sulfate phantom with imaging parameters identical to the above experiments. The line profile over the phantom was compared to the simulated frequency response.

In Vivo Imaging:

A 2D breath-hold cardiac cine exam was performed in ten normal (N=10, 8 male, age: 28±4 years) subjects subsequent to obtaining informed written consent. 2D mid-ventricular short-axis cardiac cine exams were performed using sCFA-bSSFP with FAs of 50° and 70° ($N_{segments}$=16, $N_{phases}$=25). The other imaging parameters were identical to the phantom experiments mentioned above. Twenty-five different experiments (Table 1) for the same mid-ventricular short-axis slice were acquired with each bSSFP schemes in each volunteer.

The ECG signal was recorded during image acquisition for offline reconstruction of the aVFA-bSSFP and aCFA-bSSFP images. The acquisition duration for both the aVFA-bSSFP and aCFA-bSSFP experiments was 15 s. The acquisition duration for the sCFA-bSSFP acquisitions depended on the heart rate variation during the image acquisition and averaged 12±2 s.

2D short-axis cardiac cine images were also acquired using aCFA-bSSFP with the maximum FA based on the individual patient's SAR limit. A aVFA-bSSFP scheme (50_$\alpha_{high}$_40_40, where $\alpha_{high}$ was 98±1°) with SAR approximately matched to patient-specific SAR for aCFA-bSSFP) ($\alpha$=74±5° was also acquired in order to evaluate the potential increase in blood-myocardium CNR using aVFA-bSSFP compared to aCFA-bSSFP with similar SAR.

TABLE 1

Twenty-five different VFA-bSSFP and CFA-bSSFP schemes used for simulations and imaging experiments. The VFA-bSSFP schemes in non-bold were used to determine the scheme with blood-myocardium CNR similar to CFA-bSSFP of 50° and bold VFA-bSSFP schemes were used to determine the scheme with blood-myocardium CNR similar to CFA-bSSFP of 70°. The VFA-bSSFP scheme is represented as $\alpha_{low}\_\alpha_{high}\_N_{ramp}\_N_{high}$.

|  | $\alpha_{high}$ = 50° | $\alpha_{high}$ = 70° | $\alpha_{high}$ = 90° |
|---|---|---|---|
| $\alpha_{low}$ = 10° | 10_50_20_40 | 10_70_20_40 | 10_90_20_40 |
|  | 10_50_40_40 | 10_70_40_40 | 10_90_40_40 |
|  | 10_50_20_80 | 10_70_20_80 |  |
|  | 10_50_40_80 | 10_70_40_80 |  |
|  |  | 10_70_60_80 |  |
|  |  | 10_70_20_100 |  |
|  |  | 10_70_40_100 |  |
| $\alpha_{low}$ = 30° | 30_50_20_40 | 30_70_20_40 |  |
|  | 30_50_40_40 | 30_70_40_40 |  |
|  | 30_50_20_80 | 30_70_20_80 |  |
|  | 30_50_40_80 | 30_70_40_80 |  |
| $\alpha_{low}$ = 50° | CFA-bSSFP 50 | 50_70_20_40 |  |
|  |  | 50_70_40_40 |  |
| $\alpha_{low}$ = 70° |  | CFA-bSSFP 70 |  |

Image Reconstruction:

The aVFA-bSSFP and aCFA-bSSFP images were reconstructed offline retrospectively, using MATLAB. The first shot consisted of significant signal transients during the approach to steady-state and was discarded during image reconstruction. Subsequently, each k-space line was associated with a normalized time (between 0 and 1) based on its time-of-acquisition with respect to the corresponding RR-interval (cardiac cycle) obtained from the ECG data. Each $k_y$-line, was then linearly interpolated into 25 cardiac phases, coil combined (sum of squares), 2D Fourier transformed, and the magnitude resulted in 25 cardiac cine images.

In Vivo Data Analysis:

The SNR of the blood and myocardium were measured using ROI analysis. ROIs were drawn over the septum and left ventricular blood of the single shot diastolic images and the mean signal was measured. The interpolated images were not used for this analysis to avoid any complex impact on the measured signal and noise. The standard deviation of the background noise was also measured. SNR was calculated as the ratio of the mean signal to the standard deviation of the noise. Blood-myocardium CNR was calculated as the ratio of signal difference of blood and myocardium to the standard deviation of the noise. A paired student t-test was performed to test for significant differences between the mean blood-myocardium CNR and SAR values obtained for the aVFA-bSSFP and aCFA-bSSFP experiments.

Comparison of the Bloch Simulation and Measured Data:

The experimentally measured values were scaled to best fit the simulation results based on linear least squares fit between all the simulations and mean experimental data. This was performed for the following experiments: 1) simulation versus measured signal phantom 2) simulation versus measured frequency response; and 3) comparison of the simulated blood and myocardial signal and measured blood and myocardial SNR. The correlation coefficient (R) was calculated between the simulated and the mean of the measured experimental data.

Simulations and Phantom Experiments

Figure 3:
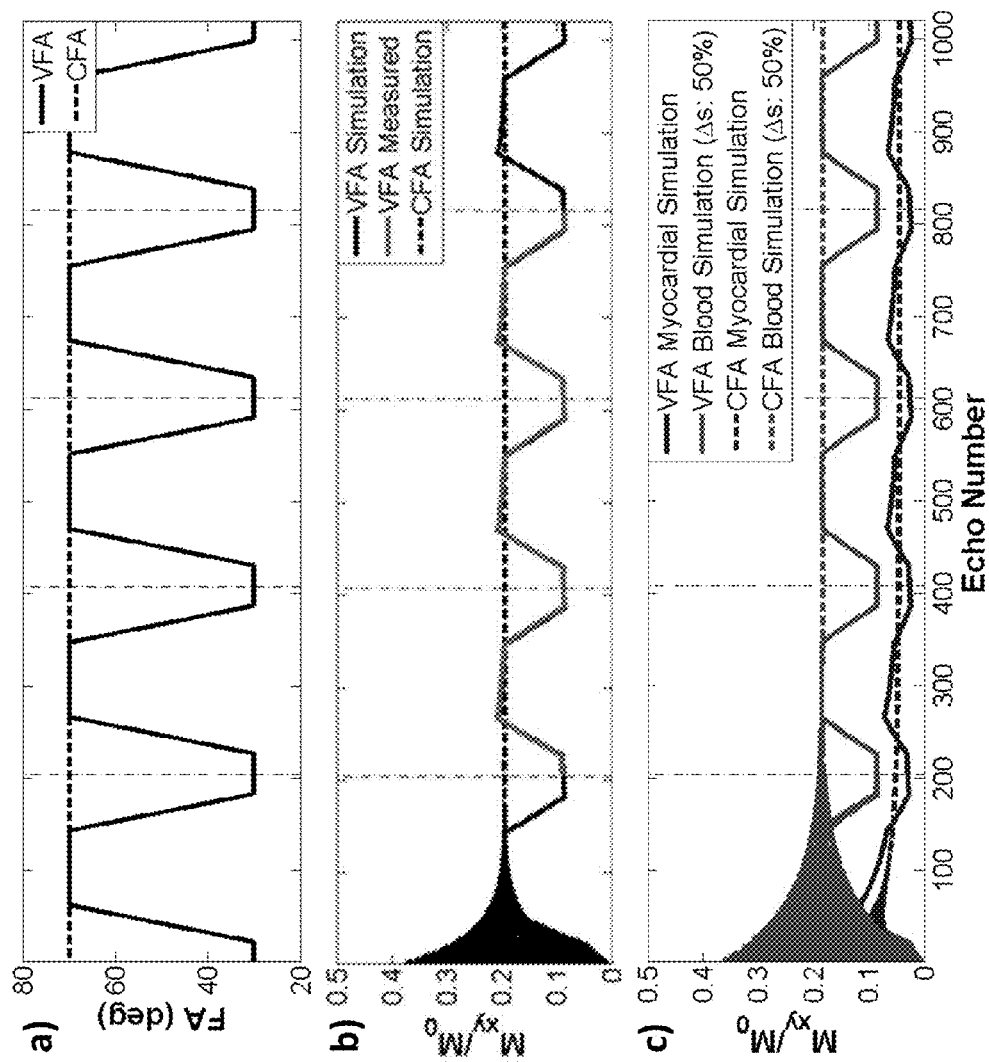
FIG. 3, comprising

The FA schemes for the simulation and phantom experiments of VFA-bSSFP and CFA-bSSFP are shown in FIG. 3A. The simulation of the transverse magnetization for the phantom using the VFA-bSSFP and CFA-bSSFP (FIG. 3B), demonstrates the repeated dynamic steady-state signal using the VFA-bSSFP scheme and the constant signal of the CFA-bSSFP scheme after the first ~150 echoes. The measured signal obtained from the nickel-sulfate phantom agrees well (R=0.99) with the simulation confirming the accurate simulation of the dynamic steady-state signal (FIG. 3B). Simulation of the myocardium and flowing blood signals for the VFA-bSSFP scheme (FIG. 3C) demonstrate a consistent dynamic steady state signal after the first single shot measurement (FIG. 3A). The duration of the transverse magnetization signal transient (time to reach steady-state) is slightly shorter using the 30_70_40_80 VFA-bSSFP scheme compared to CFA-bSSFP scheme.

Figure 4:
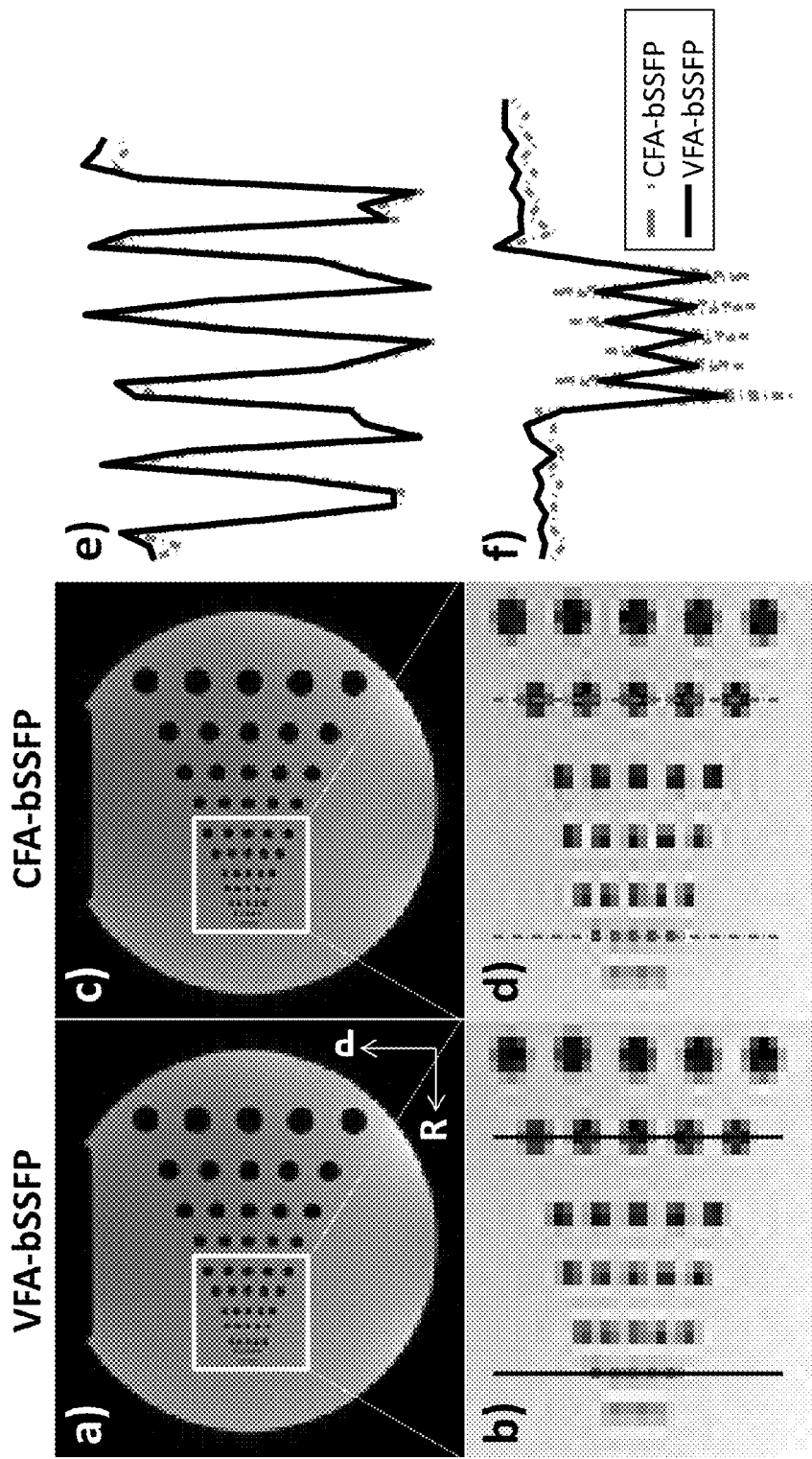
FIG. 4, comprising
Figures 5A, 5B:
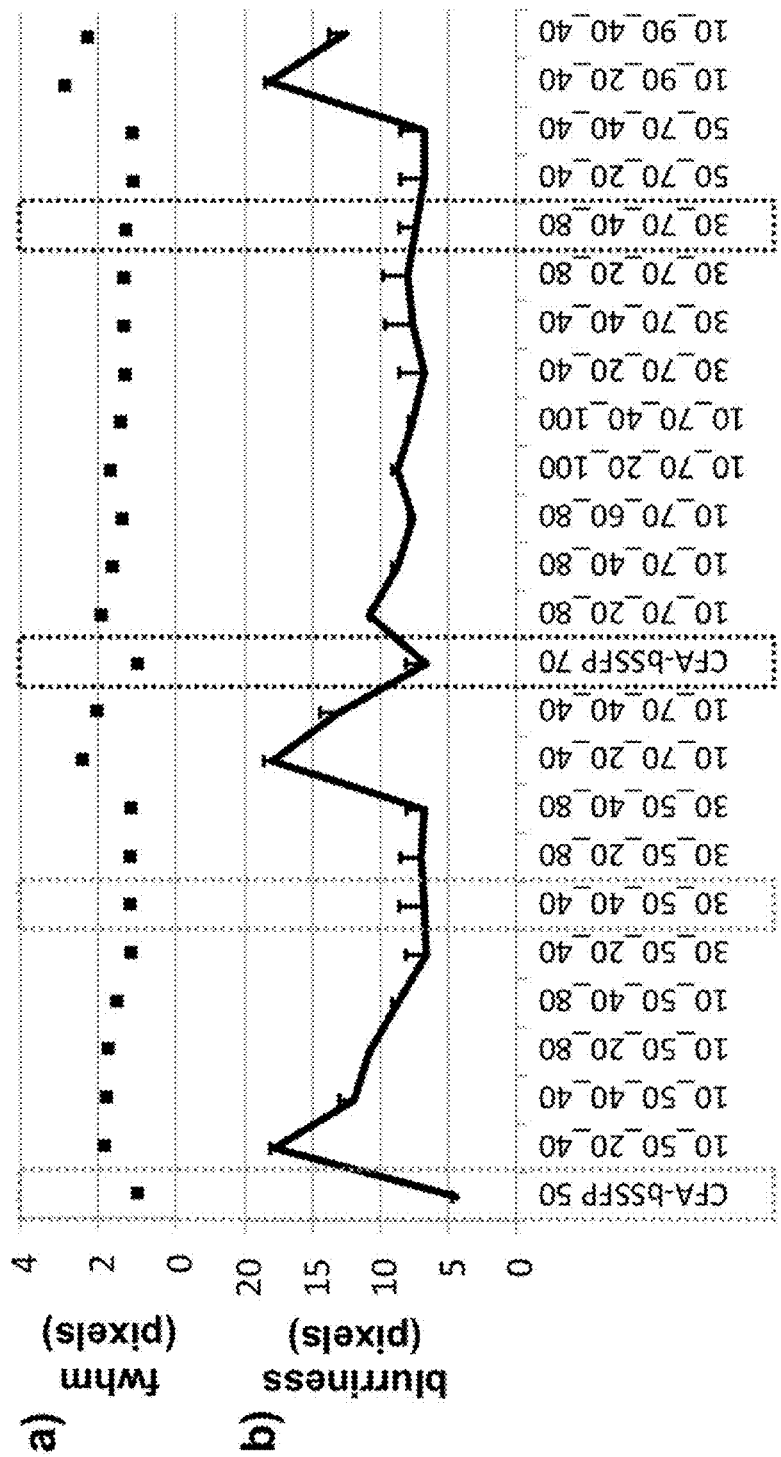
FIG. 5A through FIG. 5E, depicts the results of experiments. Simulated FWHM of the point spread function (FIG. 5A) and the mean of the measured image blurriness (FIG. 5B) over a line profile (FIG. 5C, solid white line) of the phantom along the phase encoding direction agrees well for the 25 different experiments. The phase encoding (P) and the readout (R) axes are labeled. The black dotted rectangles highlight the comparison of the CFA-bSSFP 70° with its corresponding 30_70_40_80 VFA-bSSFP scheme. The gray dotted rectangles highlight the comparison of CFA-bSSFP 50° and its corresponding 30_50_40_40 VFA-bSSFP scheme. Example simulations of the point spread function of CFA-bSSFP 70° (dashed line) and 30_70_40_80 VFA-bSSFP (solid line) are shown in (FIG. 5D) and the corresponding line profile drawn over the center solid line are shown in (FIG. 5E).
Figures 5C, 5D, 5E:
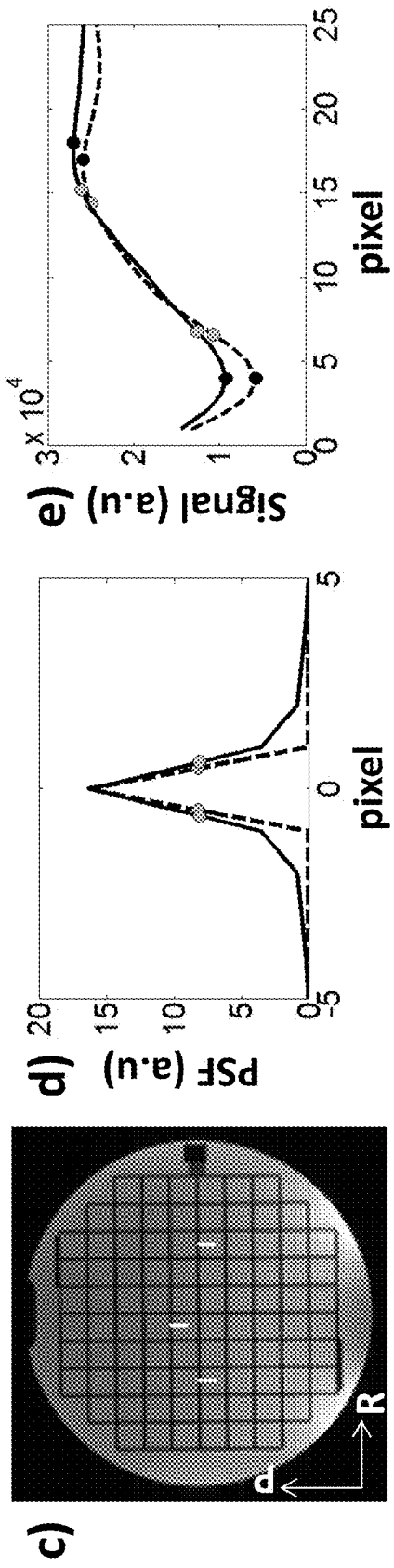

Dynamic steady state (third shot) resolution phantom images (FIG. 4A-FIG. 4D) show that both the VFA-bSSFP and CFA-bSSFP schemes have similar sharpness for low-resolution objects (FIG. 4E). However, the smaller objects appear slightly blurred for VFA-bSSFP (30_70_40_80) compared to CFA-bSSFP (70°) due to the modulation of signal across k-space (FIG. 4F). SAR, however, is also decreased by 36% (0.49 vs. 0.76 W/kg). The simulation results show that the FWHM is increased 30% for the VFA-bSSFP scheme compared to CFA-bSSFP (1.3 vs. 1.0) as shown in FIG. 5A. The simulation of the FWHM of the point spread function and phantom measurements of the mean image blurriness measured from the line profile (FIG. 5C) along the phase encoding direction (FIG. 5A and FIG. 5B) agree well (R=0.91) for the 25 different VFA-bSSFP experiments. Example images showing the simulated PSF of 70° CFA-bSSFP and 30_70_40_80 VFA-bSSFP are shown (FIG. 5E) and the line profiles drawn in the phantom images are also shown (FIG. 5F) for the corresponding acquisitions.

Figure 6:
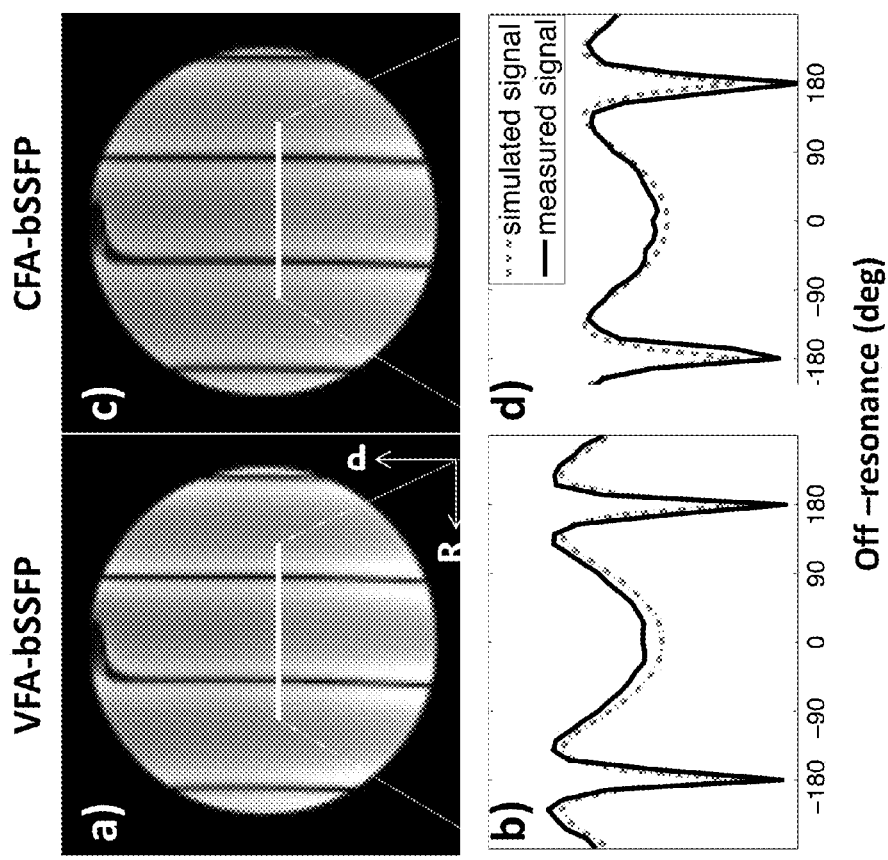
FIG. 6, comprising

The phantom experiments during application of the additional linear gradient shows that the VFA-bSSFP scheme has banding artifacts at multiples of 1/TR similar to the CFA-bSSFP scheme (FIG. 6A and FIG. 6C). The measured line profile and simulated frequency profiles (FIG. 6B and FIG. 6D) agree well (R=0.93).

In Vivo Analysis

Figure 7:
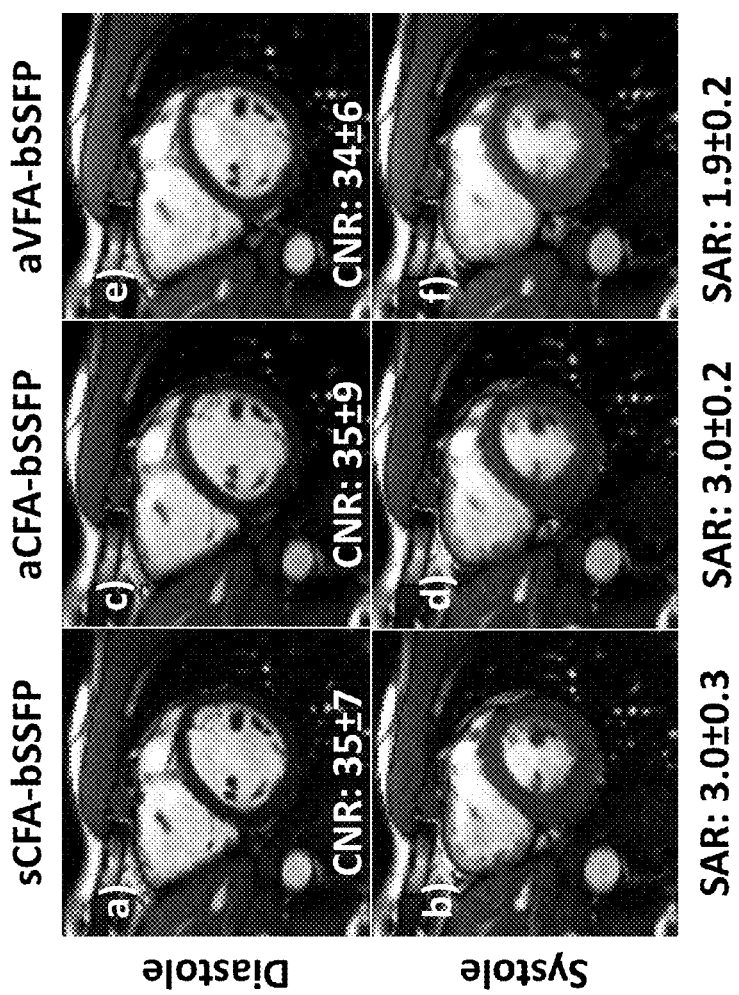
FIG. 7A through FIG. 7F, depicts the results of experiments. Diastolic (top row) and systolic (bottom row) images of a volunteer acquired with conventional sCFA-bSSFP (FIG. 7A and FIG. 7B) of 70°, aCFA-bSSFP (FIG. 7C and FIG. 7D) of 70° and 30_70_40_80 aVFA-bSSFP (FIG. 7E and FIG. 7F) scheme. aVFA-bSSFP has blood-myocardium CNR similar to aCFA-bSSFP (34±6 vs. 35±9, P=0.5) with reduced SAR (1.9±0.2 vs. 3.0±0.2 W/kg, P<10$^{-10}$). The SAR and CNR of the sCFA-bSSFP were similar to aCFA-bSSFP experiments (3.0±0.3 W/kg, 35±7).
Figure 8:
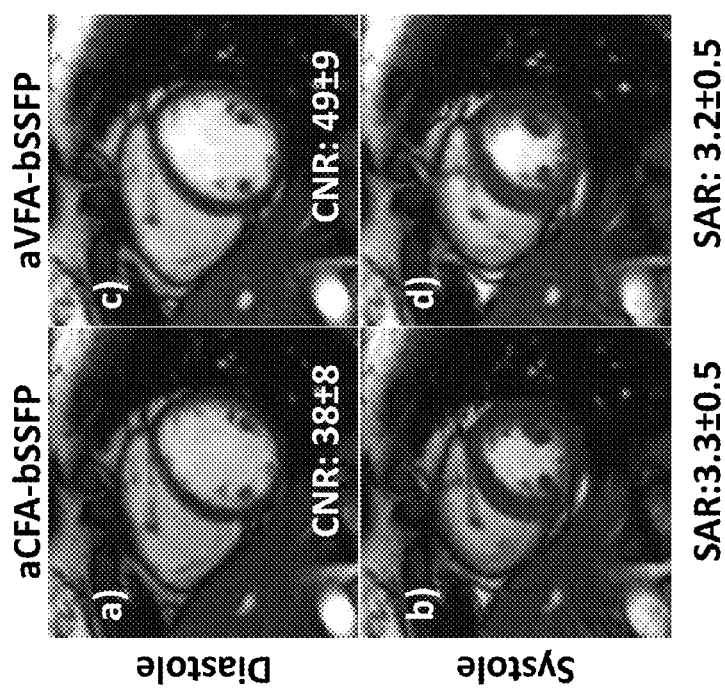
FIG. 8, comprising

Diastolic and systolic images acquired in a normal subject with sCFA-bSSFP) (FA=70°, aCFA-bSSFP of 70° and aVFA-bSSFP (30_70_40_80) are shown in FIG. 7. The SAR of aVFA-bSSFP compared to aCFA-bSSFP is significantly decreased by 36% (1.9±0.2 vs. 3.0±0.2 W/kg, $P<10^{-10}$) for similar blood-myocardium CNR (34±6 vs. 35±9, P=0.5). The SAR and blood-myocardium CNR of the sCFA-bSSFP were similar to aCFA-bSSFP experiments (3.0±0.3 W/kg, 35±7). FIG. 8 shows diastolic and systolic images acquired in a normal subject using the maximum (SAR limited) aCFA-bSSFP of 70° and aVFA-bSSFP (50_98_40_40). The blood-myocardium CNR of the aVFA-bSSFP compared to aCFA-bSSFP is improved by 28% (49±9 vs. 38±8, $P<10^{-4}$) with similar SAR (3.2±0.5 vs. 3.3±0.5 W/kg, P=0.6).

Figure 9:
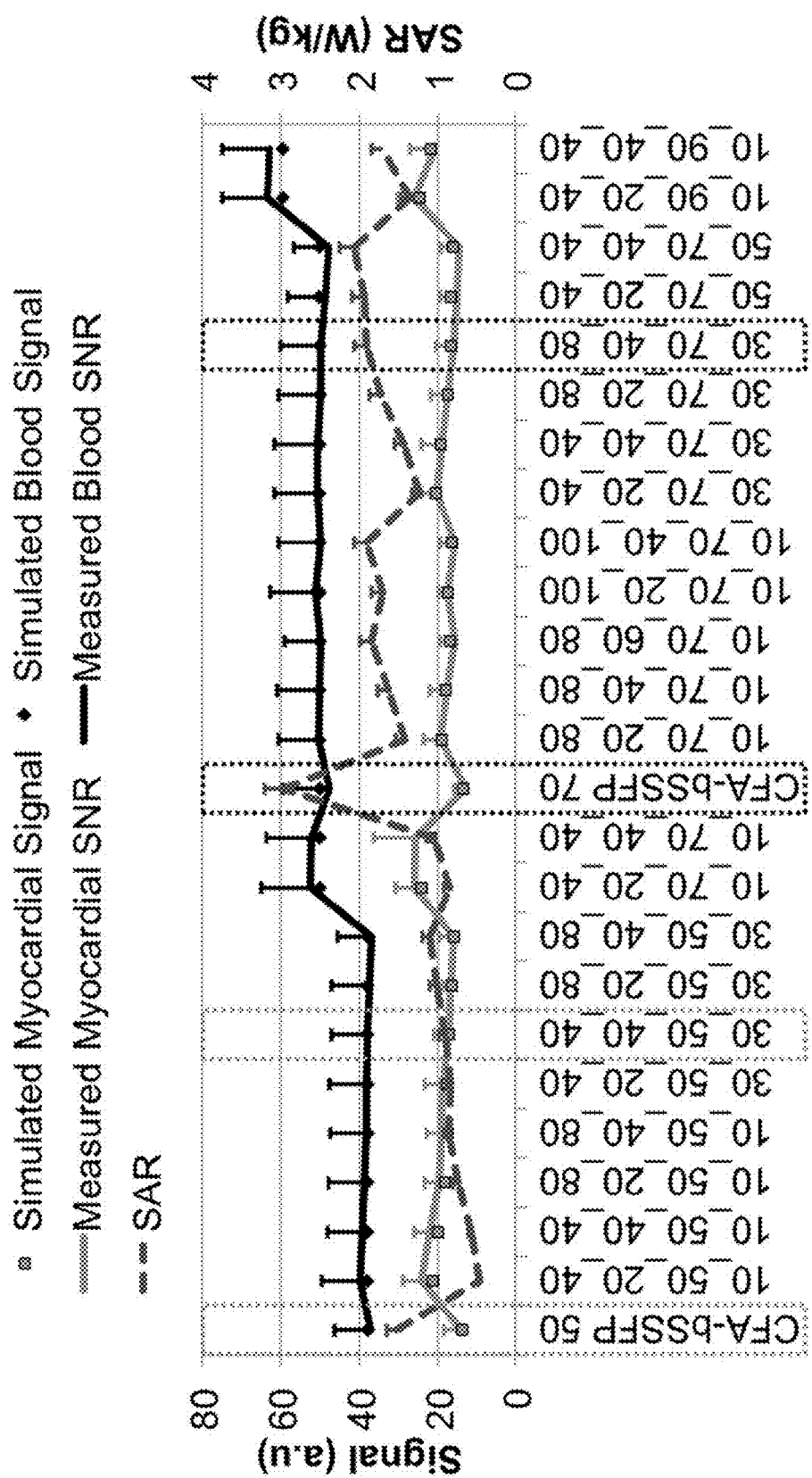
FIG. 9 is a graph depicting the results of experiments demonstrating that the measured myocardial (gray solid line) and blood (black solid line) SNR from diastolic images for 25 different aCFA-bSSFP and aVFA-bSSFP sequences agrees well with the simulated stationary myocardial (gray squares) and flowing blood (black diamonds). The SAR (dashed line) for each sequences is also shown. The black dotted rectangles highlight the comparison of the CFA-bSSFP 70 with its corresponding 30_70_40_80VFA-bSSFP scheme. The gray dotted rectangles highlight the comparison of CFA-bSSFP 50 and its corresponding 30_50_40_40 VFA-scheme.

FIG. 9 compares the simulated myocardial signal and the simulated flowing blood signals to the in vivo mean myocardial SNR and blood SNR in 10 subjects for the 25 different aVFA-bSSFP and aCFA-bSSFP experiments. The error bars show the standard deviation of these values in 10 volunteers. The mean and standard deviation of the SAR of each of these sequences is also indicated. The simulated signal and measured SNR of the myocardium (R=0.95) and blood (R=0.98) agree well.

Lower SAR or High Contrast Imaging aVFA-bSSFP can be used for low SAR cardiac cine imaging with similar myocardial and blood SNR and blood-myocardium CNR compared to the conventional sCFA-bSSFP sequence with minimal loss in image resolution. This may prove especially useful for imaging exams wherein SAR is a concern (patients with implanted devices and real time imaging). aVFA-bSSFP can also be used to improve the blood-myocardium CNR compared to the CFA-bSSFP with similar SAR because it accommodates a higher effective FA. This may prove especially useful for cardiac cine imaging at 3 T where the FA is typically SAR-limited, which results in lower than desired CNR; or facilitate higher CNR at 1.5 T for more easier analysis of cardiac function.

Bloch simulations and the in vivo results show that aVFA-bSSFP can produce myocardial and blood signal similar to aCFA-bSSFP imaging while significantly reducing SAR and only slightly broadening the FWHM. The myocardial and blood signal simulations and in vivo myocardial and blood SNR results agree well. The current aVFA-bSSFP sequence does not accommodate parallel imaging, but the principles described herein are compatible with parallel imaging. When using parallel imaging the percent SAR reduction accorded by using aVFA-bSSFP will be less than when parallel imaging is not used.

The different parameters for the aVFA-bSSFP scheme should be chosen carefully for cardiac cine imaging. The blood SNR of the aVFA-bSSFP scheme is strongly dependent on $\alpha_{high}$. For example, two different VFA schemes with constant $\alpha_{high}$, but variable $N_{high}$, $N_{ramp}$, and $\alpha_{10}$ such as 10_70_40_100 and 30_70_20_80 (FIG. 9) have similar ventricular blood SNR due to the strong dependence on $\alpha_{high}$. Hence, $\alpha_{high}$ should be chosen based on the desired blood-myocardium CNR (higher $\alpha_{high}$ produces greater CNR).

Lower $N_{high}$ and lower $N_{ramp}$ pulses with low $\alpha_{low}$ reduces the SAR, but increases the image blurriness (e.g. 10_70_20_40 vs. 10_70_40_80 FIG. 5a-b). Furthermore, if $N_{ramp}$ is too low, ghosting artifacts (Paul and Hennig, 2004, In Proceedings of the 12th Meeting of International Society for Magnetic Resonance in Medicine (ISMRM) Kyoto, Japan; 2663) will arise due to the residual signal oscillations during transition between the low and high steady states. Therefore image blurriness and ghosting artifacts determine the lower bound on the acceptable $N_{ramp}$ and $N_{high}$. Non-linear ramp trajectories such as a Kaiser-Bessel trajectory (Busse, 2004, Magn Reson Med 51(5):1031-1037) could also be used to reduce signal oscillations during the transition between steady states while ramping from $\alpha_{low}$ to $\alpha_{high}$, but initial results (not shown) indicate only minimally observable differences for $N_{ramp} \geq 20$. The upper bound of the $N_{ramp}$ and $N_{high}$ depends on the desired SAR reduction and image blurriness. For example, two VFA schemes with different $N_{high}$ and $N_{ramp}$ such as 10_70_20_100 and 10_70_40_80 have similar blood-myocardium CNR and similar phantom image blurriness, but increased SAR of 1.69 vs. 1.62 W/kg respectively.

Lower $\alpha_{low}$ increases the image blurriness, but decreases the total acquisition SAR. For example, the VFA schemes 10_70_20_40 and 30_70_20_40 have measured phantom image blurriness of 18.6 vs. 11.4, simulated FWHM of 2.4 vs. 1.32 and SAR of 0.21 vs. 0.32 W/kg respectively. Hence, $\alpha_{low}$ should be chosen carefully such that the image blurriness is within acceptable limits for the overall reduction in SAR. The experiments were performed with constant $N_{ky}$=204. The dependence of the VFA scheme parameters on the image blurriness and SNR should be considered even for experiments with different phase resolution ($N_{ky}$). The aVFA-bSSFP cardiac cine imaging did not use preparation pulses to catalyze the sequence to steady state. However, preparation pulses like Kaiser Bessel (Le Roux, 2003, J Magn Reson 163(1):23-37) can be used to further reduce the preparation duration and overall SAR of the sequence.

The results from FIG. 9 and FIG. 5A show that the 30_50_40_40 aVFA-bSSFP scheme produces the least difference in blood-myocardium CNR compared to aCFA-bSSFP of 50° (21±6 vs. 23±5) with a minimal increase in the FWHM to 1.2 and SAR reduced by 40% (0.9±0.1 vs. 1.5±0.1 W/kg). The 30_70_40_80 aVFA-bSSFP scheme produces the least difference in blood-myocardium CNR compared to aCFA-bSSFP of 70° (34±6 vs. 35±9) with minimal increase in FWHM to 1.3 and maximum reduction in SAR of 36% (1.9±0.2 vs. 3.0±0.2 W/kg).

Low SAR imaging is important in patients with implanted devices such as pacemakers and ICDs to reduce the heating at the lead tip that could damage the surrounding tissue (16). aVFA-bSSFP (30_70_40_80) can reduce the SAR by 36% compared to sCFA-bSSFP (70°) cardiac cine imaging, while maintaining SNR and CNR and largely preserving resolution. Further simulation and experiments need to be performed to optimize the aVFA-bSSFP scheme parameters to produce blood-myocardium CNR similar to sCFA-bSSFP while maximizing SAR reduction and minimizing image blurring.

The aVFA-bSSFP sequence uses an asynchronous k-space acquisition. The asynchronicity provides acquisition of all $k_g$-lines during all cardiac phases. For example, if the TR=4 ms, $N_{ky}$=180 (TR·$N_{ky}$=720 ms) and RR-interval=800 ms, 10 cardiac phases can be acquired uniformly in 9 RR-intervals. If, however, TR=4 ms, $N_{ky}$=200 (TR·$N_{ky}$=800 ms) and RR-interval=800 ms, then the k-space acquisition and cardiac cycle are synchronous and the same k-space line will be acquired for each point in the cardiac cycle. Hence, only one cardiac phase can be reconstructed. This is also equivalent to acquiring synchronously the same single shot image for each cardiac cycle. However, in practice due to changes in the RR-interval during image acquisition, each cardiac phase may not be sampled uniformly. As a result, certain cardiac phases may be oversampled and the other cardiac phases may be under-sampled. Further developments and experiments are needed to refine techniques to uniformly sample k-space for all the cardiac phases.

The image blurriness was measured in the phantom images using the line profile along the phase encoding direction. These measurements agreed well with the simulation measurements of the FWHM of the point spread function (FIG. 5). However, similar measurements such as septal sharpness (Larson et al., 2005, Magn Reson Med 53(1):159-168) over diastolic images did not result in significant differences between the aVFA-bSSFP and aCFA-bSSFP schemes due to poor alignment of the myocardial septum with the phase encoding direction and other concomitant sources of blurring.

The data presented herein demonstrates that aVFA-bSSFP can be used for: 1) low SAR (at least 36% lower) cardiac cine imaging with similar blood-myocardium CNR compared to the conventional sCFA-bSSFP imaging; or 2) high CNR (at least 28% higher) cardiac cine imaging with similar SAR compared to aCFA-bSSFP imaging, while nearly maintaining spatial resolution. aVFA-bSSFP may prove useful for cardiac structural and functional imaging in patients with implanted devices, three-dimensional imaging, real time imaging, high-field imaging, and any cardiac cine application that is SAR-limited.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

What is claimed:

1. A method of obtaining one or more images during real-time MR imaging, comprising:
   delivering a plurality of radio frequency (RF) pulses in an MRI pulse sequence during consecutive cycles, wherein the RF pulse amplitude is modulated between a low flip angle to a high flip angle and back down to the low flip angle to maintain a dynamic steady state, and wherein an acquisition in the MRI pulse sequence is structured to acquire low spatial frequencies with the high flip angles and high spatial frequencies with the low flip angles.

2. The method of claim 1, wherein the method comprises imaging an object comprising acquiring segments of a k-space, wherein a high flip angle is used for acquiring the contrast information at the center of the k-space, and a low flip angle is used for acquiring the object's edge information at the edges of the k-space.

3. The method of claim 2, wherein the acquisition of k-space segments is asynchronous.

4. The method of claim 1, wherein the method maintains image quality while reducing specific absorption rate (SAR).

5. The method of claim 1, wherein the method maintains SAR while improving image contrast.

6. The method of claim 1, wherein the high flip angle is about 50°-100°.

7. The method of claim 1, wherein the low flip angle is about 5°-30°.

8. The method of claim 1, wherein at least one of the one or more images is a 2-D image.

9. The method of claim 1, wherein at least one of the one or more images is a 3-D image.

10. The method of claim 1, wherein the RF pulse amplitude is modulated between the low flip angle to the high flip angle and back down to the low flip angle in a trapezoidal pattern.

11. The method of claim 4, wherein the SAR is reduced by at least 10% compared to conventional segmented constant flip angle-balanced steady-state free precession (sCFA-bSSFP) imaging with similar contrast-to-noise ratio (CNR).

12. The method of claim 1, wherein the method is used for an imaging technique selected from cardiac cine imaging, dynamic imaging, diffusion weighted imaging, and angiography.

13. A system for producing one or more images during real-time MR imaging, comprising:
   a circuit in communication with a MRI system configured to deliver a plurality of radio frequency (RF) pulses in an MRI pulse sequence during consecutive cycles, wherein the RF pulse amplitude is modulated to maintain a dynamic steady state and an acquisition in the MRI pulse sequence is structured to acquire low spatial frequencies with high flip angles and high spatial frequencies with low flip angles, wherein the acquisition is further structured to fill k-space asynchronously with respect to a physiological interval defined by a first physiological signal and a second physiological signal of a subject, and wherein the number of RF pulses in the physiological interval are equal to the number of acquired k-space segments.

14. The system of claim 13, wherein the circuit is configured for acquiring segments of a k-space, wherein a high flip angle is used for acquiring the contrast information at the center of the k-space, and a low flip angle is used for acquiring the object's edge information at the edges of the k-space.

15. The system of claim 13, wherein the system maintains image quality while reducing specific absorption rate (SAR).

16. The method of claim 13, wherein the system maintains SAR while improving image contrast.

17. The system of claim 13, wherein the high flip angle is about 50°-100°.

18. The system of claim 13, wherein the low flip angle is about 5°-30°.

19. The system of claim 13, wherein at least one of the one or more images produced by the system is a 2-D image.

20. The system of claim 13, wherein at least one of the one or more images produced by the system is a 3-D image.

21. The system of claim 13, wherein the RF pulse amplitude is modulated between the high flip angles and the low flip angles in a trapezoidal pattern.

22. The system of claim 15, wherein the SAR is reduced by at least 10% compared to conventional segmented constant flip angle-balanced steady-state free precession (sCFA-bSSFP) imaging with similar contrast-to-noise ratio (CNR).

23. The system of claim 13, wherein the system is used for an imaging technique selected from cardiac cine imaging, dynamic imaging, diffusion weighted imaging, and angiography.

* * * * *